US008487268B2

(12) United States Patent
Gerthsen et al.

(10) Patent No.: US 8,487,268 B2
(45) Date of Patent: Jul. 16, 2013

(54) METHOD FOR THE PRODUCTION OF MULTIPLAYER ELECTROSTATIC LENS ARRAY

(76) Inventors: Dagmar Gerthsen, Karlsruhe (DE); Fabian Perez-Willard, Aalen (DE); Katrin Schultheiss, Karlsruhe (DE)

(*) Notice: Subject to any disclaimer, the term of this patent is extended or adjusted under 35 U.S.C. 154(b) by 584 days.

(21) Appl. No.: 11/990,907

(22) PCT Filed: Aug. 5, 2006

(86) PCT No.: PCT/EP2006/007780
§ 371 (c)(1),
(2), (4) Date: Dec. 3, 2009

(87) PCT Pub. No.: WO2007/022862
PCT Pub. Date: Mar. 1, 2007

(65) Prior Publication Data
US 2010/0065741 A1    Mar. 18, 2010

(30) Foreign Application Priority Data
Aug. 24, 2005   (DE) .......................... 10 2005 040 267

(51) Int. Cl.
*G21K 5/04*    (2006.01)
*H01J 37/24*   (2006.01)
(52) U.S. Cl.
USPC ................. 250/396 R; 250/309; 250/311
(58) Field of Classification Search
USPC ............ 250/306, 307, 309, 310, 311, 396 R, 250/397, 398
See application file for complete search history.

(56) References Cited

U.S. PATENT DOCUMENTS

| 5,814,815 | A  | * | 9/1998  | Matsumoto et al. | .......... | 250/311 |
| 6,741,016 | B2 |   | 5/2004  | Benning et al.   |            |         |
| 6,797,956 | B2 | * | 9/2004  | Benner           | .......... | 250/311 |
| 2004/0222382 | A1 |   | 11/2004 | Hartley          |            |         |
| 2005/0087696 | A1 |   | 4/2005  | Choi et al.      |            |         |
| 2008/0035854 | A1 | * | 2/2008  | Jin et al.       | .......... | 250/396 R |

FOREIGN PATENT DOCUMENTS

| DE | 102 00 645 A1 | 7/2003 |
| EP | 0782170 A2    | 7/1996 |
| JP | 63013247 A    | 1/1988 |
| JP | 9237603 A     | 9/1997 |
| WO | WO 03/068399 A2 | 8/2003 |

OTHER PUBLICATIONS

Optimizing Phase Contrast in Transmission Electron Mircroscopy w/an Electrostatic Phase Plate Article13pgs from www.sciencedirect.com, 2006.
Fabrication of a Boersch Phase Plate for Phase Contrast Imaging in a Transmission Electron Microscope Article 4pgs from 2006 American Institute of Physics Ref.# XP-002418322, 2006.

* cited by examiner

*Primary Examiner* — Nicole Ippolito
(74) *Attorney, Agent, or Firm* — Reising Ethington P.C.

(57) ABSTRACT

The invention relates to a method for the production of a multilayer electrostatic lens arrangement with at least one lens electrode in general, a method for the production of a phase plate in particular as well as the lens arrangement, the phase plate and a transmission electron microscope with the phase plate.
The lens arrangement or the phase plate is produced from a thin self-supporting silicon nitride membrane which is fixed in a macroscopic chip with deposition of further layers.
The central bore as well as the aperture opening are milled out by means of an ion beam.

37 Claims, 9 Drawing Sheets

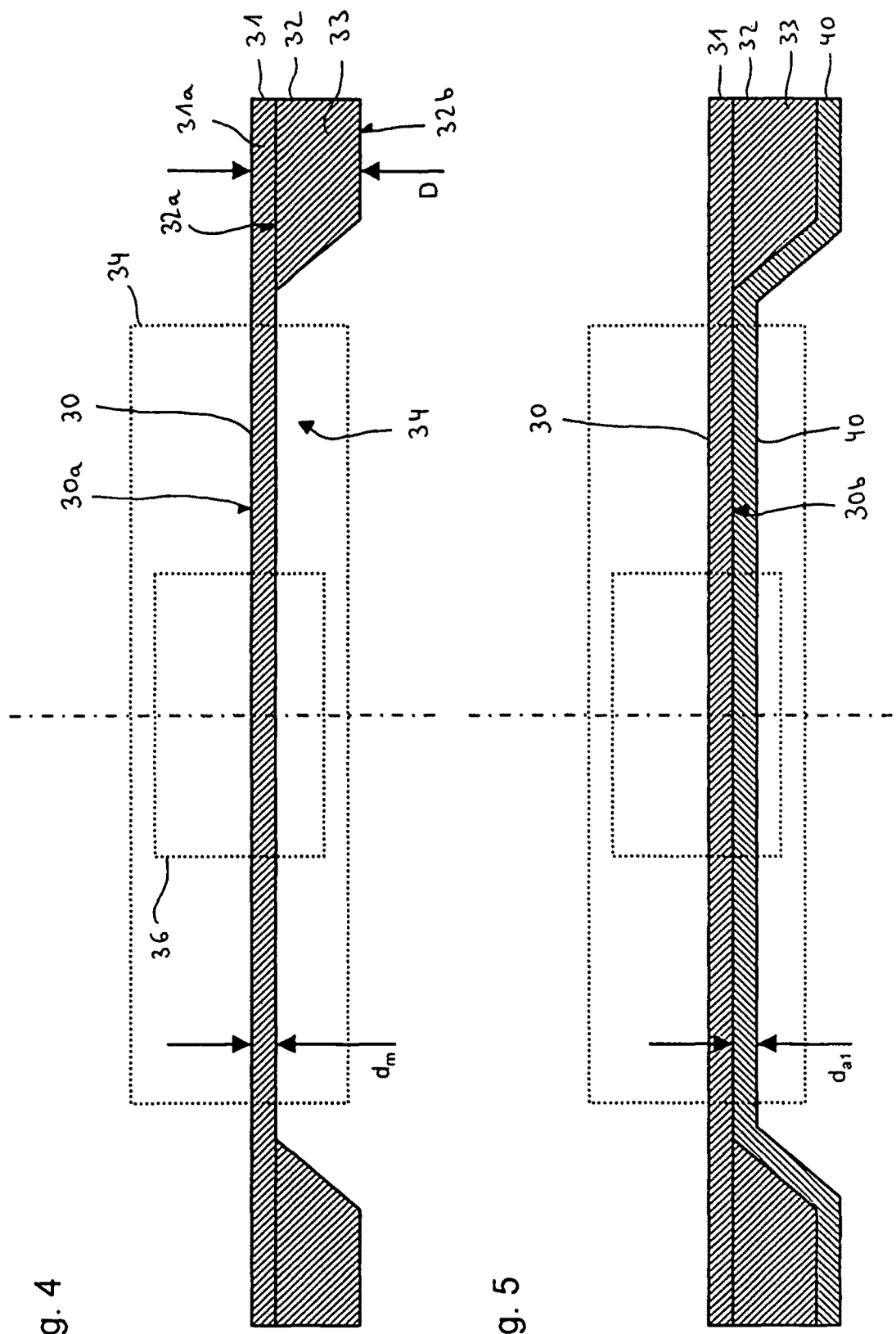

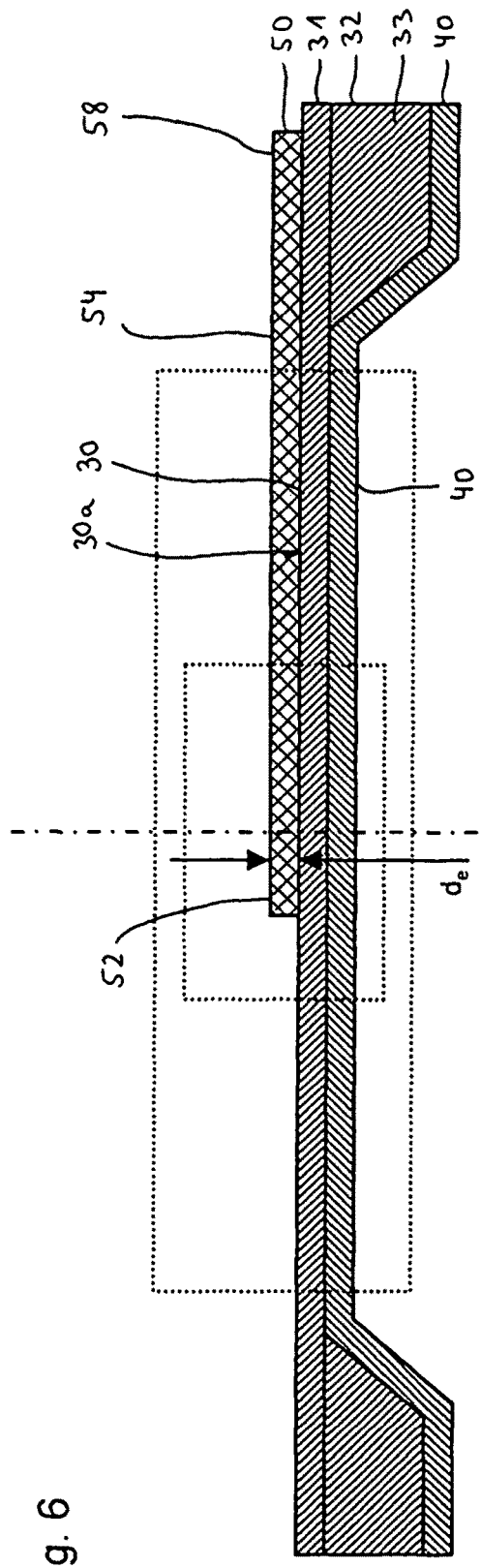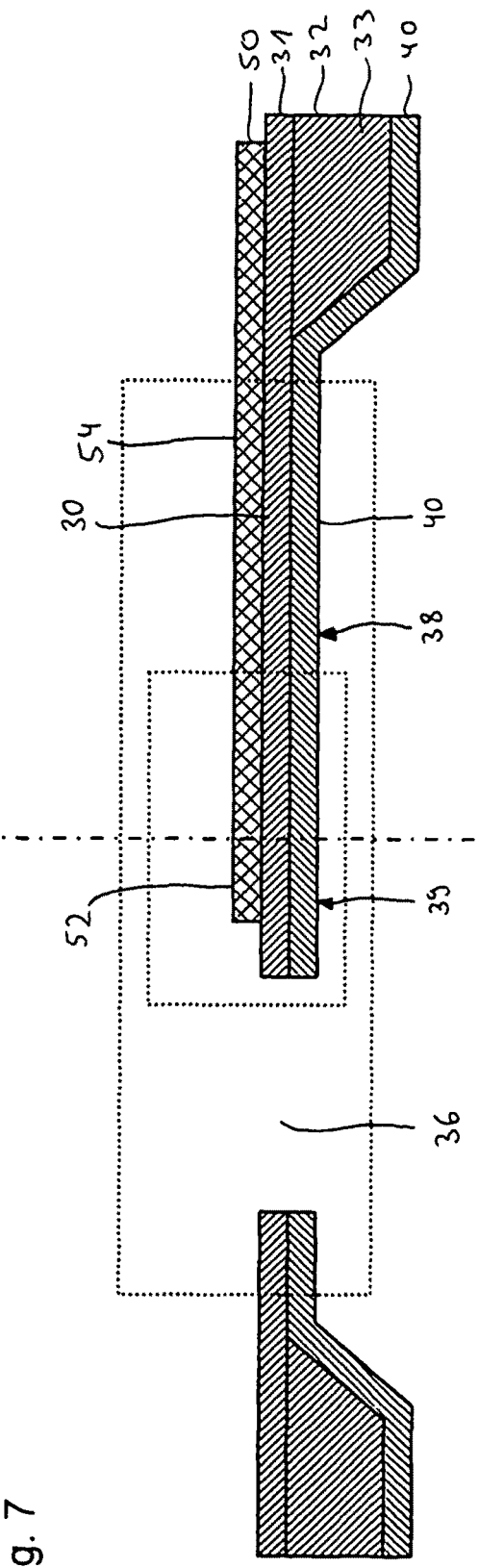

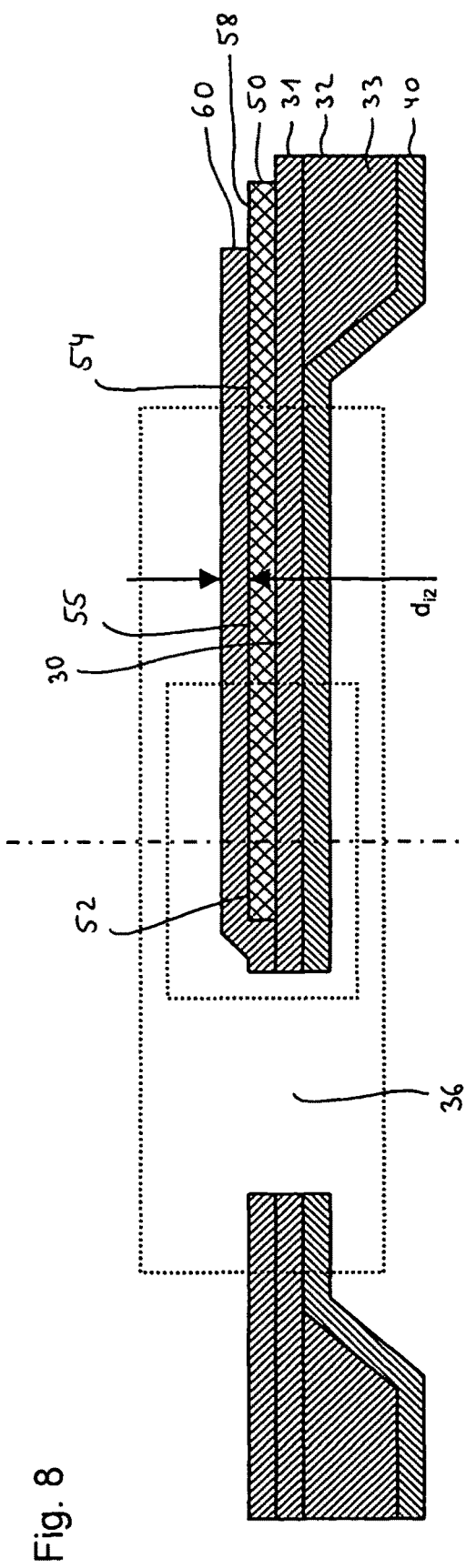
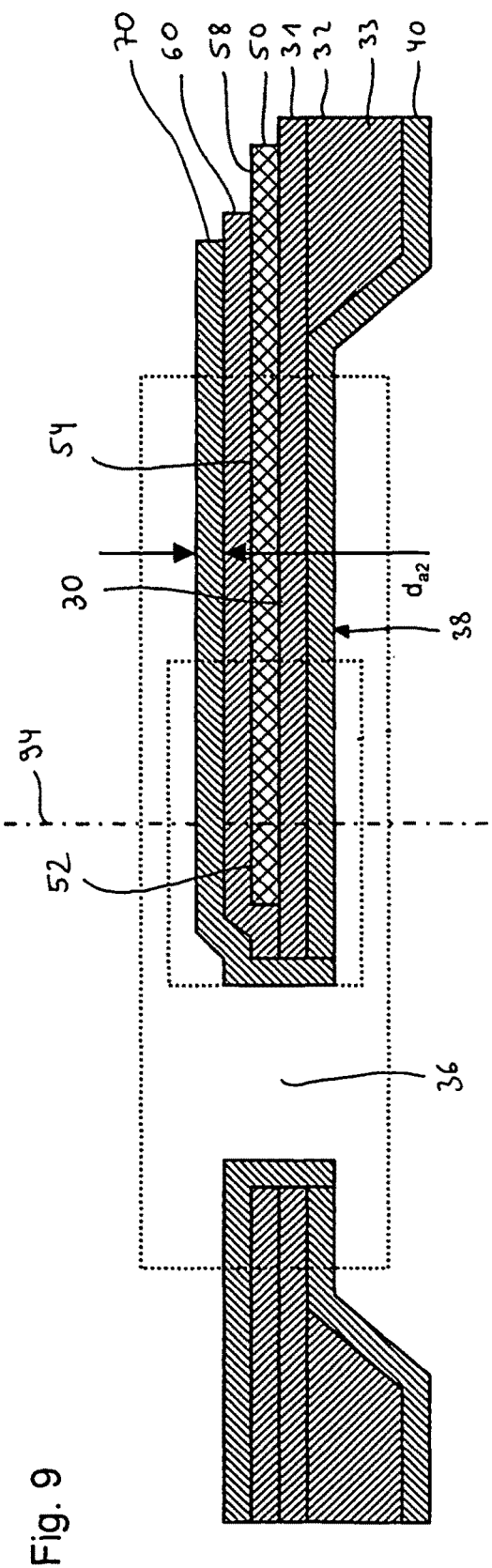
Fig. 8
Fig. 9

METHOD FOR THE PRODUCTION OF MULTIPLAYER ELECTROSTATIC LENS ARRAY

FIELD OF THE INVENTION

The invention relates to a method for the production of a multi-layer electrostatic lens arrangement with at least one lens electrode in general, a method for the production of a phase plate in particular as well as the lens arrangement, the phase plate and a transmission electron microscope with the phase plate.

BACKGROUND OF THE INVENTION

The present invention arose from the need to produce a so-called Boersch phase plate. However, the method developed by the inventors can also be used for the production of other multi-layer electrostatic lens arrangements.
One frequently employed method for the examination of the structure of for example biological-medical objects is transmission electron microscopy (TEM), with which a resolution in the range of less than 1 nm can be achieved. With this, structural details of an object in the range of nearly atomic dimensions can be depicted. Biological objects consist however predominantly of light elements like carbon, hydrogen and oxygen, so that the high-energy electrons, which are used for the formation of the image, are virtually not absorbed. For this reason no usable amplitude contrast comes into being so that the object in the image remains invisible in the case of an amplitude contrast measurement.

However, the phase of the electrons is slightly shifted. Therefore one refers to objects with this property as phase objects. They can therefore be made visible with a phase contrast electron microscope. For the generation of the highest possible phase contrast in the case of phase objects the phase of the non-scattered electrons (null beam electrons) is shifted by about 90°, in order to obtain a maximum phase contrast in the case of the subsequent superimposition of the phase-shifted non-scattered electrons with the scattered electrons in an interference pattern. The phase displacement of the null beam can in principle be realized by a phase plate.

In light microscopy the use of a phase plate for phase contrast microscopy is already realized in practice. For this purpose a so-called Zernicke phase plate in the form of a $\lambda/4$ platelet in the back focal plane of the objective lens is used.

A known method for a TEM works with the generation of phase contrast without phase plates. In this connection it is necessary to defocus the image in order to obtain structural information about the object. In order to cover the greatest possible range of space frequencies so-called defocus series (several images with variable defocusing) are recorded. This is very awkward and tedious. Further complicating matters in the recording of image series is the fact that the samples are frequently photosensitive and can only be loaded with a low electron dose without significant radiation damage. For this reason the signal-to-noise ratio in the images of a defocus series is low. Therefore the image quality is in great need of improvement. To the best of the inventors' knowledge this method constitutes the only actually practicable method for phase contrast electron microscopy.

Another solution for the generation of phase contrast according to the knowledge of the inventors which however up to now is still more or less theoretical is based on the usage of a phase plate for a TEM which produces the desired phase displacement of typically 90° between scattered and non-scattered electrons in the back focal plane of the objective lens of the transmission electron microscope.

However, the technical realization of a phase plate for a TEM is extraordinarily difficult, a fact which lies in the extremely small wavelength of the electrons in the magnitude of $10^{-12}$ m in comparison to the wavelength of visible light $(4 \ldots 7 \times 10^{-7}$ m).

An embodiment which is in the research stage provides a thin carbon film which is positioned in the back focal plane of the microscope objective lens. A small hole with a diameter of about 1 µm is located in the middle of the carbon film, through which said hole the beam of the non-scattered electrons passes. The scattered electrons on the other hand pass through the carbon film and undergo an additional phase displacement in relation to the non-scattered electrons through the inner potential of the carbon film. Such a phase plate is also termed as a Zernicke phase plate. The usage of such a Zernicke phase plate has proved impracticable up to now due to the following difficulties.

Due to the inelastic scattering of the electrons in the carbon film the electron coherence is partially lost. Further the granularity of the carbon film leads to spatial fluctuations of the phase displacement. In addition the carbon film is damaged by the high-energy electrons. The spatial inhomogeneous contamination of the carbon film connected to the slight thickness of about $3 \times 10^{-8}$ leads to electrical charges and uncontrollable phase displacements. Further the phase displacement can be controlled only by the thickness of the film. If said thickness changes, for example through contamination, the plate must be expensively removed and replaced by a new plate. In principle, setting of the phase displacement is not possible without replacement of the plate.

For these reasons the usage of a Zernicke phase plate for a TEM has proved to be impracticable.

Recently in Ultramicroscopy 99, 211 (2004) Lentzen proposed realizing a Zernicke phase plate with the help of a double hexapole aberration corrector in the imaging system. The proposed structure however is expensive and extremely cost-intensive.

A considerably better variant for a phase plate in the opinion of the inventors is the so-called Boersch phase plate. While it is true that it was already proposed in the year 1947 by Hans Boersch in "About the Contrasts of Atoms in the Electron Microscope", Z. Naturforschung, 2a, 615-633, 1947; to the best of the inventors' knowledge the actual production of a Boersch phase plate however has not been managed to this very day. The extraordinary difficulty lies in the small dimension of the phase plate and its nevertheless complex structure. For this reason only more or less theoretical approaches are known from EP 0 782 170 A2 and WO 03/068399. For the sake of a better understanding the fundamentals of a phase contrast microscope will be described first.

The principle of phase contrast electron microscopy is shown in FIG. 1. In the case of a transmission electron microscope 1 an electron source 2 produces a high-energy electron beam 4 which is directed by a first and second condenser lens 5, 6 in order to screen the sample 8 for an upper objective lens. The scattered and non-scattered electrons are focused by an objective lens 9 and traverse the phase plate 20 in the back focal plane of the objective lens 9.

The null beam 10, that is, the non-scattered electrons are guided through an electric field 12 which is produced by a ring electrode 14. Through the electric field 12 the null beam electrons 10 undergo a phase displacement in comparison to the scattered electrons 16 which do not pass through the electric field.

After a first intermediate image 17 the electrons pass through an intermediate lens 18 and a projection lens system 19 in order to produce an image 22 of the sample for example on a film or a CCD chip 24.

In EP 0 782 170 A2 a proposal is now made for a phase plate for a phase contrast electron microscope. For the contemplated production a foundation made of a silicon substrate, covered on both sides with etch-resistant layers, is used. This layer arrangement is however only a subcarrier and not a component of the phase plate to be produced (compare FIGS. 6a through 6e in EP 0 782 170 A2). The structure of the phase plate takes place by means of the depositing of insulating and metallic layers as well as etching method. Finally however the silicon carrier with the etch-resistant layers must be completely removed in a two-stage process by means of etching of the highly sensitive phase plate. EP 0 782 170 A2 is silent about how this is to take place in detail. Also in other respects the production remains unclear in many points. However, the method is complicated by a multitude of depositing and etching steps as well as the removal of the auxiliary substrate. In addition a great probability exists that in the event of the removal of the auxiliary substrate the highly sensitive phase plate will be destroyed. For this reason the method appears to be at least little practicable.

However, an actual realization is not known.

In addition FIGS. 6a through 6e as well as the description on Page 7, lines 4 through 35 in EP 0 782 170 A2 only show the production of the central electrode of the phase plate. However, said electrode must be suspended in an aperture stop in the case of a Boersch phase plate. EP 0 782 170 A2 gives no information at all about how this should happen, so that no complete teaching on the production of a Boersch phase plate can be inferred from here.

Further WO 03/068399 describes a phase plate for electron microscopy. In this publication however, it is a matter of the non-mirror-symmetrical arrangement of the carriers of the electrode. This special geometry is described as advantageous for the reconstruction of image information using the Friedel symmetry. This phase plate consists of an annular electrode with an inside diameter of about 1 μm, through which the null beam is guided. The ring electrode is fastened for example via three webs to a mount. Apart from some preferred forms of the mounting device (compare FIGS. 1-3 of WO 03/068399) formed from the carriers the document does not specify its own production method. Reference is only made to EP 0 782 170 with regard to the details of the structure of the phase plate. For this reason the foregoing described disadvantages and problems are the same.

Although the Boersch phase plate was already proposed in 1947 by Hans Boersch, even including the teachings from EP 0 782 170 and WO 03/068399, to this day no Boersch phase plate that has been actually produced is known. To the best of our knowledge, the inventors have now succeeded in doing this for the first time with the production method proposed here.

GENERAL DESCRIPTION OF THE INVENTION

Accordingly, it is an object of the invention to provide an actually realizable production method for a Boersch phase plate.

A further object of the invention is to provide a versatile and improved method for the production of microlenses or nanolenses in general.

Yet another object of the invention is to provide a simple, cost-effective method for the production of a microlens or nanolens arrangement that is suitable for serial production, in particular of a Boersch phase plate with high yield.

Still another object of the invention is to provide a well manageable, stable, qualitatively high-value and cost-effective microlens and nanolens arrangement or Boersch phase plate.

The object of the invention is solved by the subject matter of the independent claims. Preferred embodiments of the invention are defined in the dependent claims.

In accordance with the invention a method for the production of a multi-layer electrostatic microlens arrangement is proposed, in which at least one lens electrode is electrically shielded on both sides by means of shielding layers in order to produce an electric lens field in an inner opening of the lens electrode. The method comprises the following steps:

a) Providing a manageable stable mounting chip which is significantly larger and thicker than the lens arrangement to be produced is and which exhibits at least one thinned out membrane window with a considerably thinned out or even self-supporting membrane made of a first membrane material with regard to the substrate material of the chip, wherein the membrane or original membrane is fixed in the membrane window in particular integrally with the chip and wherein the membrane represents a first layer of the lens arrangement to be produced. In other words the membrane is simultaneously a component of the sturdy and well manageable chip or wafer and forms preferably its front plane surface. Preferably the membrane is a thin layer or a thin film produced on the chip front before the rear thinning out of the chip and is considerably thinner than the macroscopic mounting chip.

b) Application of a second layer made of a coating material on a first side of the membrane, wherein either the membrane or the chip material is an electric insulating material and the coating material is an electric conductive material or the membrane or chip material is an electric conductive material and the coating material is an electric insulating material, so that an at least two-layer membrane of an electric insulating first insulating layer and an electric conductive first shielding layer fixed in the window of the chip comes into being. The second layer is preferably applied by means of known PVD or CVD techniques. A galvanic or electron or ion beam supported deposition however also seems possible. Thus e.g. in the case of an insulating original membrane a metal layer is vapor-deposited or in the case of a metal foil as original membrane the insulating layer is deposited. In the process preferably the first insulating layer is arranged on the front and the metal layer is arranged on the rear.

An original membrane made of silicon nitride has proved to be particularly suitable. Preferably the original membrane exhibits a thickness of less than 5 μm, preferably between 30 nm and 1 μm. However layer thicknesses down to 20 nm or even 10 nm are possible. The self-supporting membrane surface within the window ranges preferably between about 10×10 μm² and a few cm², preferably between 20×20 μm² and 5×5 mm². Especially preferred are membrane thicknesses from 50 nm to 200 nm as well as membrane sizes between 50×50 μm² and 500×500 μm². The membrane can be square, or possess another near random two-dimensional geometric form. Dependent on the membrane size a wafer can exhibit several membranes and/or several lenses or phase plates can be produced in one membrane.

The silicon nitride membrane possesses in advantageous manner a surface sufficiently smooth for the subsequent spin-on deposition of the lithographic varnish, in particular on the front. The self-supporting membrane was produced in the following way. A crystalline silicon wafer or chip is first polished. On the polished side a silicon nitride layer is deposited by means of CVD. Preferably this is a silicon enriched silicon nitride layer ($Si_{3+x} N_{4-x}$) which exhibits a lower internal voltage than stoichiometric silicon nitride. Due to the smaller lattice mismatch the silicon enriched silicon nitride layer ($Si_{3+x} N_{4-x}$) grows on silicon significantly lower in voltage than a stoichiometric silicon nitride ($Si_3N_4$). However a (reduced) internal voltage remains. This internal voltage is also present in the case of the self-supporting membranes that are used. However, in self-supporting membranes made of silicon enriched silicon nitride greater parts can be milled out than in the stoichiometric case, without endangering the integrity of the membrane. This is in particular of advantage when non-circular symmetrical parts are to be removed from the membrane. For example the aperture opening of the Boersch phase plate is only approximately circular symmetrical.

Subsequently the silicon chip is photolithographically structured from the opposite side and wet etched up to the silicon nitride layer, which in the process remains as a self-supporting membrane in the window.

Alternatively $SiO_2$, $Al_2O_3$, $MgFl_2$, nioboxide, carbide or metallic oxide in general can also be used as membrane material. The frame-like macroscopic chip around the membrane window preferably has a thickness of 100 µm to some mm and a size of e.g. 1 cm², i.e. the membrane is at least thinner by one or more magnitudes than the frame region of the chip.

c) Production of an electrode and a lead of electric conductive material on the side of the electric insulating layer of the membrane opposite the electric conductive layer. Preferably the outer form of the electrode is essentially circular and the lead is oblong with a width about that of the electrode or narrower. For this purpose preferably a metallic layer is deposited as electrode layer, in particular vapor-deposited and structured by means of the lift off technique. In the case of lift off first an exposable varnish is spin-deposited on the insulating layer of the membrane, in particular its plane front (so-called spin-coating) and said front subsequently being exposed, structured, vapor-deposited and detached. These methods are basically known to the person skilled in the art. Basically photolithographic or electron beam lithographic methods can be used with corresponding lacquering. For the very fine electrode and the lead however electron beam lithography has proved to be especially suitable. Alternatively to the lift off method a structured deposition of the electrode and lead can also be carried out by means of ion beam or electron beam supported CVD. In particular alternative non-spheric forms are also possible for the electrode.

d) Application of an electric insulating second insulating layer at least on the electrode and on the lead and the first insulating layer around the electrode so that at least the electrode, in particular completely and the lead are covered by the second insulating layer, wherein the electrode and at least partially the lead between the first and second insulating layer with a preferred thickness of 10 nm to 1000 nm, especially preferably 50 nm to 250 nm are included, in order to be electrically insulated.

e) Application of an electrical conductive second shielding layer on the side of the second insulating layer opposite the electrode, so that in the membrane window a self-supporting sandwich-like layer arrangement comes into being, which in the region of the electrode and the lead comprises at least the five following layers in the following sequence: the first shielding layer, the first insulating layer, the electrode layer, the second insulating layer and the second shielding layer. Outside of the electrode and the lead the layer arrangement exhibits preferably at least the four following layers in the following sequence: the first shielding layer, the first insulating layer, the second insulating layer and the second shielding layer. In particular the sandwich-like layer arrangement is self-supporting and not applied to an auxiliary substrate, which must be subsequently removed.

f) following Steps a) through e) in the region of the electrode the entire sandwich-like arrangement, i.e. the five layers of which the lens arrangement to be produced consists, is bored through. The layer arrangement is self-supporting in the step of the boring through, so that no auxiliary substrate is necessary to support the membrane. Accordingly in the case of the method in accordance with the invention the original membrane remains preserved as one of the layers of the layer arrangement to be produced. This circumstance is of advantage since the etching off of an auxiliary substrate can lead to the destruction of the arrangement.

By means of the complete boring through of the layer arrangement the continuous inner opening in the electrode is produced, so that the ring shape of the electrode comes into being and the layers of the lens arrangement are exposed for boring. The diameter of the hole ranges preferably from 10 nm to 100 µm, preferably 100 nm to 10 µm, especially preferably 500 nm to 4 µm.

The through hole through the five layers is preferably carried out by means of micromilling or nanomilling. For this purpose in special measure a device with which a focused ion beam can be produced and controlled (so-called focused-ion-beam device" or "Fokussierter-Ionenstrahl-Gerät") is suitable. By means of the focused ion beam the layer material is sputtered off locally, so that the borehole is cut out. This method facilitates in advantageous manner a very precise incision and avoids short circuits between the layers. The minimum achievable diameter of the hole depends on the diameter of the ion beam and the thickness of the layer arrangement. Further along with circular geometries also other lens forms like e.g. quadrupole-octupole or hexapole symmetries can be produced.

In particular Step a) takes place at least prior to Steps b) through f). Unless expressly defined, in other respects no restriction of the sequence should be defined by the designation of the steps with letters. For example Step b) can take place before or after Step c).

The production of the lens in the case of a chip with a membrane window is preferably concluded with the production of the hole. In the case of the usage of multi-membrane wafers subsequently the wafers can be divided up into individual chips with preferably one or more membrane window(s) each. It is advantageous, in particular in a TEM to use a chip with several, if necessary even different lens arrangements or phase plates, since these can then be replaced in advantageous manner without breaking the vacuum. Also a chip can contain additional free windows.

As the first and/or second shielding layer preferably a precious metal, e.g. gold, platinum or silver with a thickness of preferably 100 nm to 200 nm is vapor-deposited. However, layer thicknesses of the metal layers of down to 50 nm or less are possible. Basically even layer thicknesses between 10 nm and 5 µm are possible.

The method in accordance with the invention can be used in the foregoing described embodiment for the production of massive, i.e. with a closed surface but very thin lens arrangements. In advantageous manner the invention facilitates namely in general the production of multi-layer lens arrangements with an overall thickness of in particular less than 1 μm and lateral dimensions in the region in particular several μm up to several hundred μm or even smaller yet. These are among other things of considerable interest in the field of nanotechnology. The lens arrangements are suitable in particular for electron optics and can be adapted in a variety of ways in advantageous manner through choice of the size and/or lens thickness to the desired spatial expansion of the electric field, through choice of the insulating layer thicknesses (dielectric strength) to the desired field intensity and through choice of the form to the distribution of the field intensity.

A special application of the method in accordance with the invention presents itself with the production of a Boersch phase plate for an electron microscope, in accordance with a special embodiment of the invention. Apart from the theoretical approaches acknowledged in the introduction the inventors are not aware of any actual realizable method for the production of a Boersch phase plate. In any event the present proposed method as well as the result is of considerable advantageous simplicity but also precision.

The Boersch phase plate in accordance with the invention exhibits a frame-like aperture stop which defines an inner aperture opening for scattered electrons in the electron microscope, wherein within the aperture opening a shielded lens with a lens or ring electrode by means of at least one narrow suspension element, which radially bridges the aperture opening is suspended on the aperture stop. For this purpose first a chip with a membrane is used, which exhibits at least the size of the aperture stop. The diameter of the phase plate or aperture stop amounts e.g. to about 50 μm. Depending on the requirement however 5 μm to several hundred μm are also possible.

In addition to the foregoing described steps in a Step g) the aperture opening is produced. In the process Step g) takes place following at least Steps a) and at least one part of c) (e.g. after the lacquering), preferably following a), b) and c) and/or before Steps d), e) and/or f). The especially preferred sequence of the steps is a), b), c), g), d), e), f).

The aperture opening is preferably cut out or milled out of the layer arrangement by means of an ion beam. In particular the same "focused ion beam device" is used as later for the milling out of the bore. However, a dry etching method, e.g. reactive ion etching can also be used.

In the milling out (sputtering of the thin layers) one allows a central electrode support region of the membrane around the electrode and at least one or more connecting elements exist, such that the electrode support region is suspended in a self-supporting manner by means of the connecting elements on the aperture stop in the interior, preferably in the center of the aperture opening.

Since the Boersch phase plate is extraordinarily small, great demands are made on the precision of the position in the case of the milling. For this purpose it has proved to be advantageous to produce one or more position markings, so-called "alignment marks" on the layer arrangement prior to the milling of the aperture opening. Said alignment marks can be expediently produced in the same step as the electrode and the lead or can be deposited structured. Herewith it was actually possible to achieve a position accuracy relative to the electrode of about 100 nm.

Preferably in Step b) the second layer is applied at least on the entire surface of the aperture stop or membrane, in order to produce a shielded line also in the region of the connecting elements, i.e. also in the region of the lead, which (later) passes on one of the connecting elements. In particular in Step c) the lead is produced as extending form the electrode to at least the peripheral region of the aperture stop.

In particular the connecting element exhibits a somewhat greater width than the lead and the electrode support region exhibits a greater diameter than the electrode, so that the lead and the electrode are framed in a top view of the chip material. As a result in the deposition of the second insulating layer in accordance with Step d) a closed electrostatic insulating cladding comes into being around the electrode and the lead from the two insulating layers. Preferably the second insulating layer is applied first after production of the aperture opening, since the layer arrangement to be cut through is thinner and the alignment marks are more clearly recognizable.

Steps d) through g) are preferably carried out in the following sequence:
Production of the aperture opening in accordance with Step g) with a positioning with the help of the alignment marks,
subsequent application of the second insulating layer in accordance with Step d),
subsequent application of the second shielding layer on the second insulating layer in accordance with Step e),
subsequent boring through of the five layers of the lens in accordance with Step f).

Hence the finished phase plate exhibits a ring electrode with central opening, an electric lead, two insulating layers and two shielding layers.

Preferably the first and second insulating layers jointly form an electric insulating cladding around the ring electrode and the lead closed to the outside, wherein the cladding passes in annular manner around the ring electrode and extends along the connecting element at least to the outer edge of the aperture opening.

In accordance with a preferred embodiment of the method in accordance with the invention the phase plate is tilted in several directions during the application of the second electric conductive shielding layer in order to coat the lateral faces of the electrode support region and of the connecting element/s with the electric conductive material of the second shielding layer, wherein an electric contact between the first and second shielding layer is produced. As a result the first and second shielding layers form a closed electric conductive shielding-cage around the electrode, wherein the shielding cage is insulated electrically from the electrode by means of the first and second insulating layers or by means of the cladding. In the process the conductive cage passes in annular manner around the cladding and also extends along the connecting element at least to the outer edge of the aperture opening. In other words the suspension elements are also in essence completely covered with a conductive layer in order to effectively shield the electric field in the external region of the ring electrode or to prevent charging. Within the bore, more precisely at its outer periphery the five layers a) through e) are however exposed, in order to produce the electric lens field in the region of the bore.

As a result the electric field is restricted to the interior of the electrode and as far as possible completely shielded to the outside, so that the phase of the scattered electrons is not influenced. These are transmitted in the field-free regions between the connecting elements or mounting elements.

The subject matter of the invention is therefore also the lens arrangement or Boersch phase plate producible in accordance with the invention as well as a phase contrast transmission electron microscope with a built in Boersch phase plate in a focal plane of the microscope, wherein the null beam is guided through the ring electrode and the scattered electrons are in essence guided through the aperture opening.

The phase plate produced in accordance with the invention consequently differs structurally from those which are produced by means of an auxiliary substrate, at least due to the fact that at least one of the layers of the lens, the first suspension element and of the outer frame of the aperture stop, namely the original membrane, is machined simply continuously or integrally from one and the same self-supporting membrane layer applied two-dimensionally on the chip. Preferably the original membrane is realized as the first insulating layer of the lens arrangement and is made of silicon nitride. The remaining layers applied in Steps b) through e), i.e. the first shielding layer, the second shielding layer, the electrode layer and/or the second insulating layer are vapor-deposited or deposited, in particular by means of PVD or CVD deposited layers.

The lead comprises preferably an oblong connecting segment, which extends radially on the first connecting element of the ring electrode to the chip and runs to its front in a bonding field which can be bonded by means of conventional techniques and macroscopic contact elements, e.g. contact pins in order to be able to supply the ring electrode with voltage by means of a voltage source joined to the bonding field. For this purpose the bonding field exhibits in tangential direction a greater expansion than the lead. Preferably the ring electrode, the lead and the bonding field are integrally constructed. The distance between the bonding field and ring electrode can be varied in wide ranges.

In additional the suspension elements which bridge the aperture opening are preferably built sandwich-like. The first suspension element in which the lead passes exhibits accordingly, in particular in this sequence, at least layers a), b), c), d) and e) and the remaining suspension elements exhibits layers a), b), d) and e), in each case preferably over the entire length from the central lens to the outer edge of the aperture opening.

Preferably also the layers of the additional suspension elements are each constructed integrally with the corresponding layers of the central lens and of the first suspension element. In other words the five layers a) through e) of the lens and the five layers a) through e) of the first suspension element are each constructed integrally up to the outer frame of the aperture stop in pairs.

Conditioned by the production in accordance with the invention however the thicknesses of the layers a) through c) in the region of the suspension elements alone are dimensioned sufficiently large to suspend the electrode belonging to the central lens and the associated electrode carrier region in self-supporting manner in the aperture opening. Especially preferably the thickness of the original membrane in the region of the suspension elements alone is dimensioned sufficiently large to suspend the electrode belonging to the central lens in self-supporting manner in the aperture opening and/or to produce the lens opening in the self-supporting state.

In the following the invention will be explained more closely with the help of exemplary embodiments and with reference to the figures, wherein identical and similar elements are sometimes furnished with the same reference symbols and the features of different exemplary embodiments can be combined with one another.

BRIEF DESCRIPTION OF THE FIGURES

The figures show the following:

FIGS. 4-10 show schematic cross-sectional representations of the production in accordance with the invention of a Boersch phase plate

DETAILED DESCRIPTION OF THE INVENTION

Figure 1:
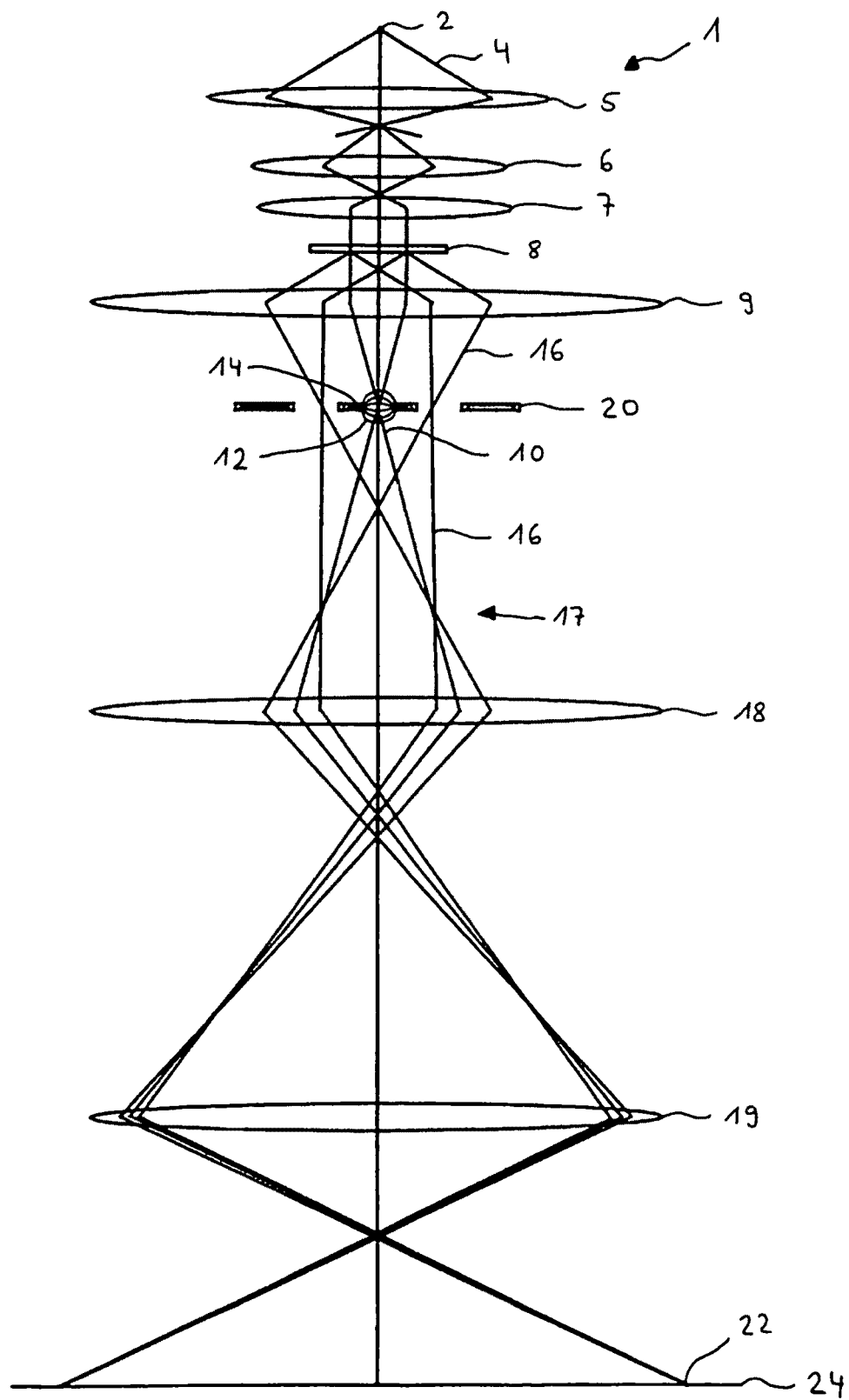
FIG. 1 shows a schematic cross-sectional representation of a phase contrast TEM with the phase plate.

FIG. 1 shows a transmission electron microscope 1 with a phase plate 20, as described in the introduction.

A plane base for the building of a layer arrangement is important for the practicability of later structuring steps in the course of the present invention. Said base can be metallic or insulating. The thickness of the base decisively influences the entire thickness of the lens arrangement to be produced. Within the framework of the invention therefore very thin membranes are used as base. The membrane becomes a component of the lens arrangement to be produced. Herewith the overall thicknesses of the lens arrangement of less than 100 nm can be realized.

Figure 2:
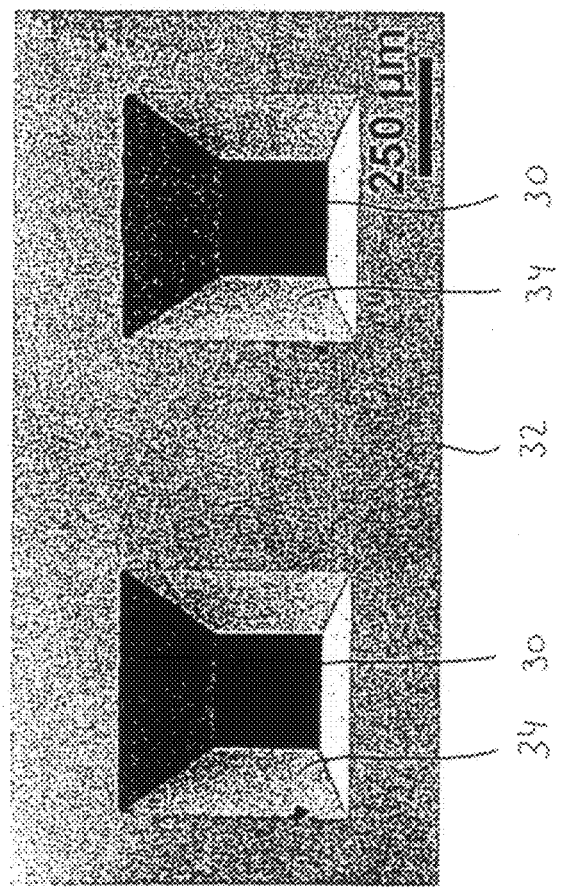
FIG. 2 shows an electron microscopic representation of a silicon chip with two silicon nitride membrane windows.

With reference to FIG. 2 a silicon enriched silicon nitride layer about 100 nm thin deposited on a silicon wafer is used, said layer forming a self-supporting silicon nitride membrane 30 in each of two membrane windows 34. Said membrane has proven to be particularly suitable, in particular since silicon nitride is an outstanding insulator.

Figure 3:
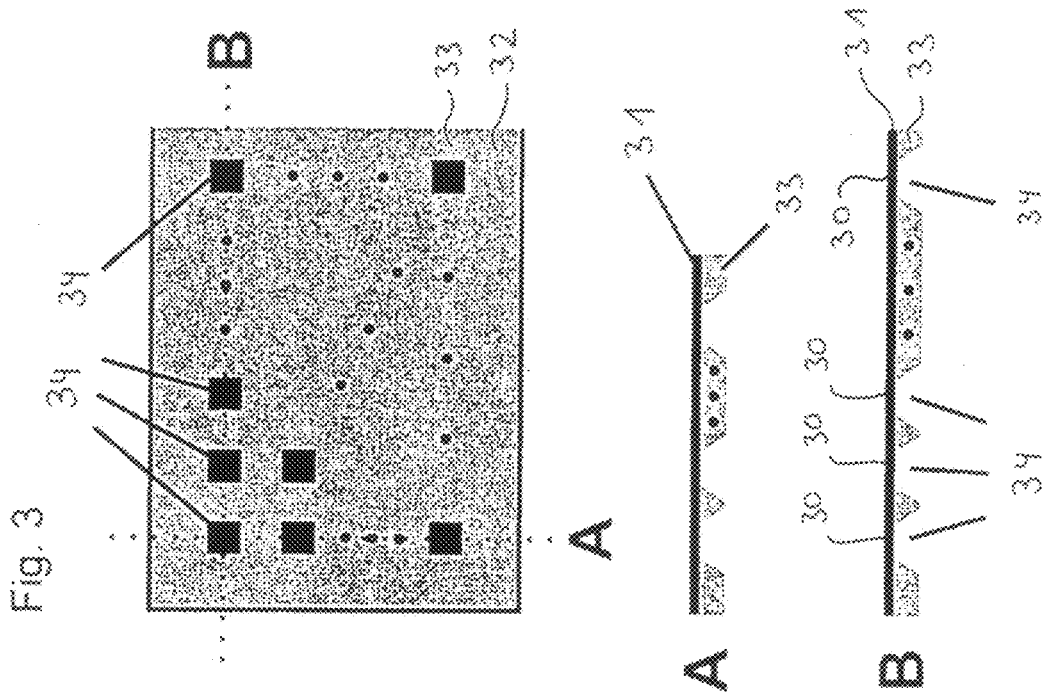
FIG. 3 shows a schematic top view of a multimembrane chip and two sections along Lines A and B.

The membrane or foil 30 is held by a stable manageable, that is considerably thicker and larger frame-type chip 32 and is mounted in FIG. 2 on the underside of the chip 32 and forms a plane surface there. The chip 32 can comprise a single membrane window 34 with a membrane 30, however two (FIG. 2) or more (FIG. 3) membrane windows 34 can also be present, i.e. several membranes 30 being held or fixed in the wafer.

Step a)

In the preferred example here the insulating silicon nitride membrane 30 within the membrane window 34 exhibits a thickness $d_m$ of about 100 nm. With reference to FIG. 4 in a first step the chip 32 is provided with the membrane 30 deposited on a plane front 32a (in FIGS. 4 through 10 above). The silicon nitride layer 31, which forms the membrane 30 exhibits with the membrane 30 a self-supporting region within the window 34 and a peripheral region 31 a integrally constructed with the self-supporting region or the membrane 30, said peripheral region being connected in a planar manner to the outer frame region 33 of the chip 32. In other words at least one of the layers is produced from a self-supporting membrane 30, said membrane extending to the frame region 33 of the chip 32. The window 34 is etched from the rear 32b (in FIGS. 4 through 10 below) of the chip 32 in these to the membrane 30, so that the window 34 defines a rear recess up to the membrane 30 in the chip 32. The used chip 32 with the silicon nitride membrane 30 was purchased from the Silson company (www.silson.com). This silicon nitride membrane 30 exhibits advantageously a sufficiently smooth surface on its front 30a in order to apply corresponding lithographic varnish via spin-on deposition in later steps.

The dotted box 34 represents the region of the phase plate to be produced and the smaller dotted box 36 represents the region of the central lens 90 which will later be suspended in a self-supporting manner in the aperture opening. The silicon nitride membrane 30 remains as one of the two insulating layers of the phase plate 20. In the process the cross-sectional drawings are not true to scale.

Step b)

In the next step, shown in FIG. 5 the underside 30b of the membrane 30 is metallized with a suitable metal layer 40. In the exemplary embodiment for this purpose the rear 30b of the silicon nitride membrane 30 is vapor-deposited with a gold layer 40 with a thickness $d_{a1}$ of about 200 nm.

Step c)

With reference to FIG. 6 on the front 30a of the membrane 30, the electrode 52 as well as the lead 54 is defined. For this purpose the insulating side of the two-layer arrangement made of layers 30 and 40 (here front 30a of the membrane 30) is varnished with a photosensitive or electron-beam-sensitive varnish (not shown). The leads and the electrode or electrodes which are to define the lenses later are optically or electron beam-lithographically exposed on this varnish. In the process several exposure steps and/or varnishing steps can be carried out. The place at which the respective exposure is to take place is given as a result of the fact that one either knows the position of the membrane 30 or membranes 30 within the chip 32 with sub-μ-precision in advance or determines said position prior to the exposure. Both optically as well as also under an electron microscope the membranes 30 offer sufficient contrast in order to localize them. In the case of a location by means of the electron microscope and in the presence of an electron beam-sensitive varnish it is ensured that the exposure threshold dose of the used varnish is not exceeded. After the exposure and development of the varnish the front of the sample is metallized and subsequently the lift off is carried out in order to produce the electrode 52 and the lead 54. In the process a metallic layer 50 is vapor-deposited, said layer extending to the chip 32, in order to be able to bond the lead 54 there later to a bonding field 58. In particular in the same step position markings 56, in this example three pieces, are preferably defined around the electrode 52, in order later to be able to position precisely the membrane 30 (compare FIG. 11). The sample can further be varnished again and subjected to a further structuring step in order to define further leads and/or electrodes.

Figure 11:
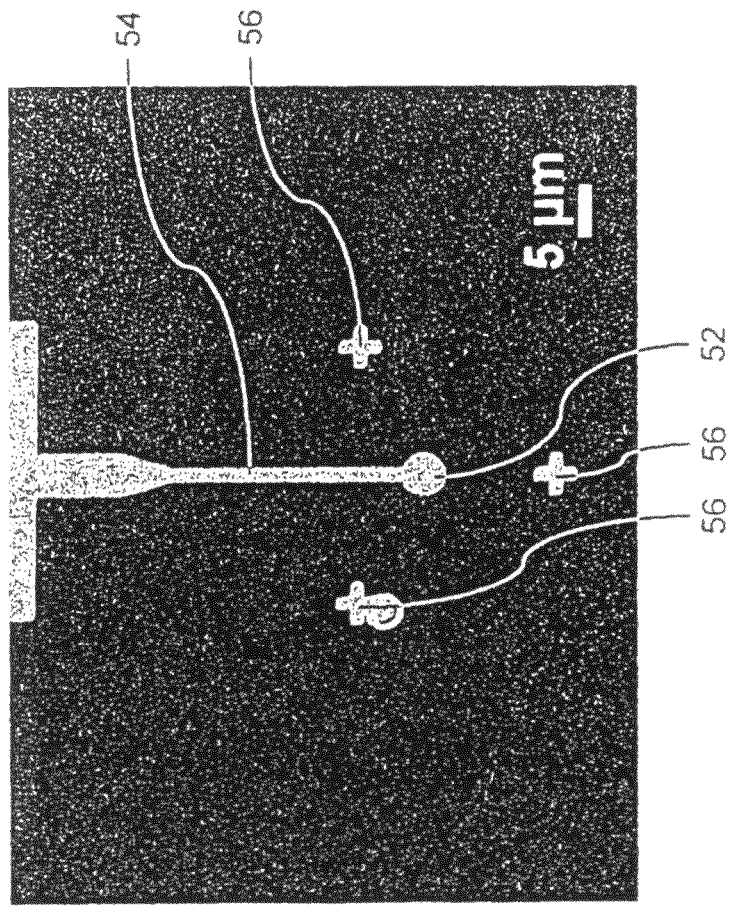
FIG. 11 shows an electron microscopic representation of a section of the membrane after application and structuring of the electrode layer corresponding to the procedure step shown in FIG. 6.

The position markings 56, so-called alignment marks, as well as the circular electrode 52 measuring about 2 μm and the approximately 1 μm wide lead 54, can be best recognized in the REM photograph of FIG. 11. The structuring can take place both optically as well as also electron-beam-lithographically, wherein it was also possible to employ combined methods successfully.

The selection of the lithographic method is a significant criterion for the minimum achievable dimensions of the structures and with it of the phase plate. Rough structures like the bonding fields 58 are efficiently produced with photolithography. In the present example the electrode 52, the directly adjacent section of the lead 54 as well as the position markings 56 are produced by means of electron beam lithography. Herewith experimental dimensions for the leads 54 and electrodes 52 of down to 30 nm width were able to be achieved. The production of even finer electrodes 52 is also possible with the help of an atomic force microscope. With the named methods dimension, arrangement and form of the electrodes can be designed variably, so that not only rotationally symmetrical but rather also field distributions with more complex symmetries can be realized. Thus aspheric lenses can also be produced with for example quadrupole, octupole or hexapole symmetry.

For production of the electrode 52, the lead 54 and the position marking 56 a gold layer was also vapor-deposited in the exemplary embodiment as the electrode layer 50. Basically however other metals are also suitable. The thickness $d_e$ of the electrode was selected between 50 nm and 200 nm depending on the exemplary embodiment. However, thinner and thicker electrodes and leads between about 10 nm and a few μm are also possible.

Step g)

With reference to FIG. 7 after the application and structuring of the electrode layer 50 with the electrode 52 and lead 54 the aperture opening 36 is produced around the electrode 52. In accordance with the invention a so-called Fokussierte-Ionenstrahl-Gerät ("focused ion beam device") is used. The device is available from Zeiss company. With this device by means of an ion beam, for example 30 kV gallium-ions, the material in the region of the aperture opening 36 around the electrode 52 and with a recessing of the connecting elements 38, in this example with a number of three, is milled out, as a result of which the general inner form of the aperture opening 36 of the phase plate 20 is defined (compare FIG. 12). In this step the material of the silicon nitride membrane 30 as well as the lower gold layer 40 are sputtered off, that is it is not lithographed and no varnish is required. Further the focused ion beam can also be used for forming an image, in order to position the membrane 30. Further the employed focused ion beam device has an additional atomic electron microscope column with which the formation of images is also possible. This was also employed in the case of the present method.

Figure 12:
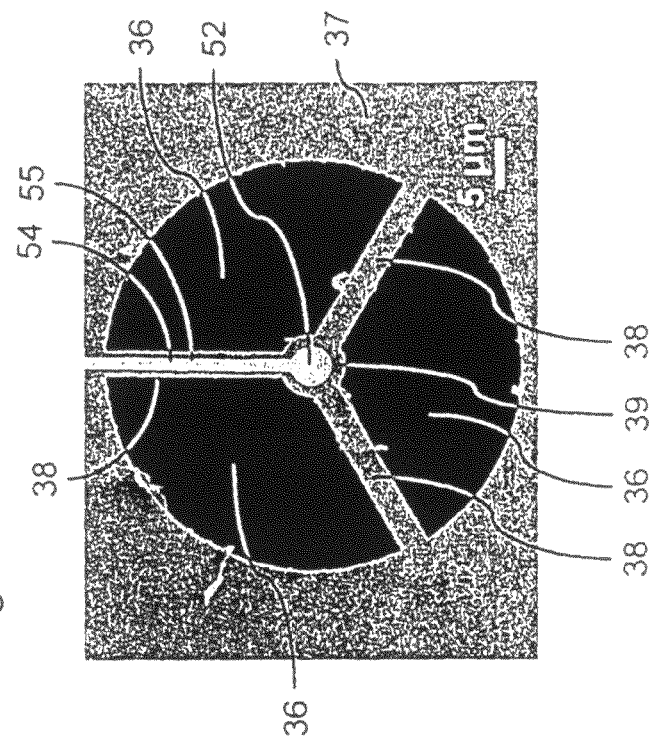
FIG. 12 shows the membrane from FIG. 11 after the milling out of the aperture opening with recessing of the electrode and the three connecting elements in accordance with the procedure step shown in FIG. 7.

As can be recognized in FIG. 12, through the step of the milling out, a base form for a self-supporting lens construction arises with a carrier region 39 of the membrane suspended on the connecting elements 38 around the electrode 52. By means of the position markings 56 a positioning is achieved with accuracy in the range of about 100 nm.

In this Step g) thus the form of the aperture opening 36, the connecting elements 38 as well as of the carrier region 39 is produced around the electrode 52. However, in this step the lens bore 80 is not yet produced.

Step d)

With reference to FIG. 8 as the next step a second insulating layer 60 is vapor-deposited on the front of the sample by means of electron ion supported PVD.

The second insulating layer 60 in the process completely covers the electrode 52 and an inner region or connecting segment 55 of the lead 54, in order to insulate the lead 54 and the electrode 52. Only the bonding field 58, so-called contact pad, is screened and not insulated. On the contact pad 58 later the electric connection of the electrode 52 via the lead 54 to macroscopic leads 96, for example contact pins or wires is made possible. However it is also conceivable to apply the second insulating layer 60 prior to the milling out of the aperture opening 36. In the exemplary embodiment aluminum oxide with a thickness $d_{i2}$ of about 200 nm has proved to be especially preferable as the second insulating layer.

Step e)

With reference to FIG. 9 a second shielding layer 70, in this example a metallic layer, more precisely a gold layer about 200 nm ($d_{a2}$) thick, is applied, more precisely is vapor-deposited. Preferably among the metallic layers a), c) and e) a chromium adhesive layer about 5 nm thick is vapor-deposited.

In the present example for the production of the self-supporting phase plate 20 with aperture opening 36 and the structures located within, the chip 32 is installed in the metallization system in such a way that an angle between the chip normal 94 and the direction of propagation of the metal vapor exists in the case of the deposition. In addition, during the coating or metallization of the chip 32 tilting and/or rotating takes place in several different directions. As a result of this, the central lens 90 and the connecting elements 38 of the phase plate are also deposited with metal laterally and thus completely enclosed in metal, so that in the case of the application of a voltage to the lead 54 and electrode 54 the electric field is completely shielded. For this purpose, in operation the shielding cage or Faraday cage formed from the first and second shielding layer 40, 70 is grounded.

The performed experiments have shown that the material for the two insulating layers 30, 60 as well as the two shielding layers 40, 70 can be widely varied. The thicknesses of the layers can vary between 10 nm and a few μm. The layer thickness of the two insulating layers 30, 60 is in the process selected sufficiently thick in order, adapted to the respective insulating material, not to exceed the break-through voltage in the operation of the lens.

Step f)

Figure 10:
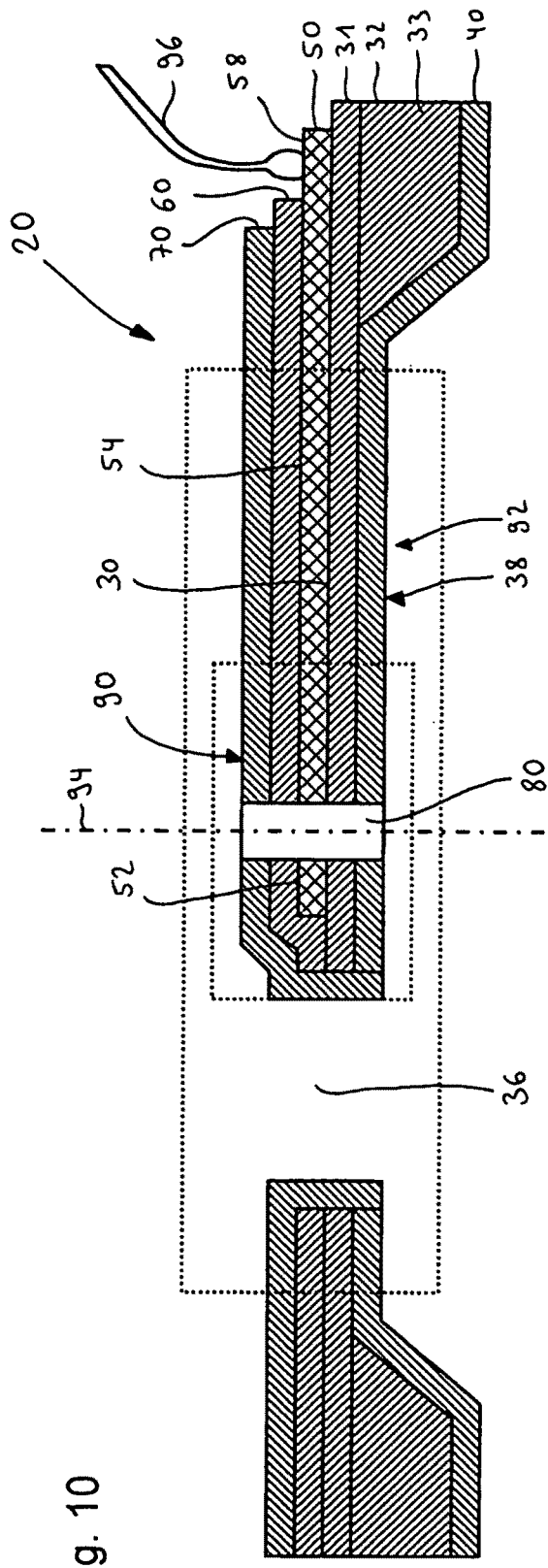

With reference to FIG. 10 by means of the focused ion beam device the central lens opening 80 is milled or cut through the entire layer packet—the five layers a) through e) including the lens electrode 52. As a result of this the ring shape of the lens electrode 52 comes into being. The milling takes place in this connection by means of local sputtering of the material. The diameter of the opening thus produced amounts to about 1 μm in the exemplary embodiment.

By means of the sputtering milling with the focused ion beam device it can be ensured that no electric short circuits arise between the different metal layers 40, 50 and 70. Through the preferred process sequence f) to e) to {d) and g)} as well as the tilting, it is ensured that the connecting elements 38 as well as the region around the ring electrode 52 are completely covered from the outside with the metal layer 70, but not the inner perimeter of the bore 80, where the three metal layers 40, 50, 70 are insulated from each other by the two insulating layers 30, 60. As can be recognized in FIG. 10, the five layers 30, 40, 50, 60 and 70 are exposed to the outer perimeter of the bore 80.

Finally the bonding field 58 is bonded by means of a macroscopic contact element 96.

The phase plate produced in accordance with the invention was tested for break-through safety and exhibits a break-through voltage greater than 2.65 V. This is sufficient for operation as a Boersch phase plate in a TEM. The typical operating voltage there lies in the range of 1 V.

Figure 13:
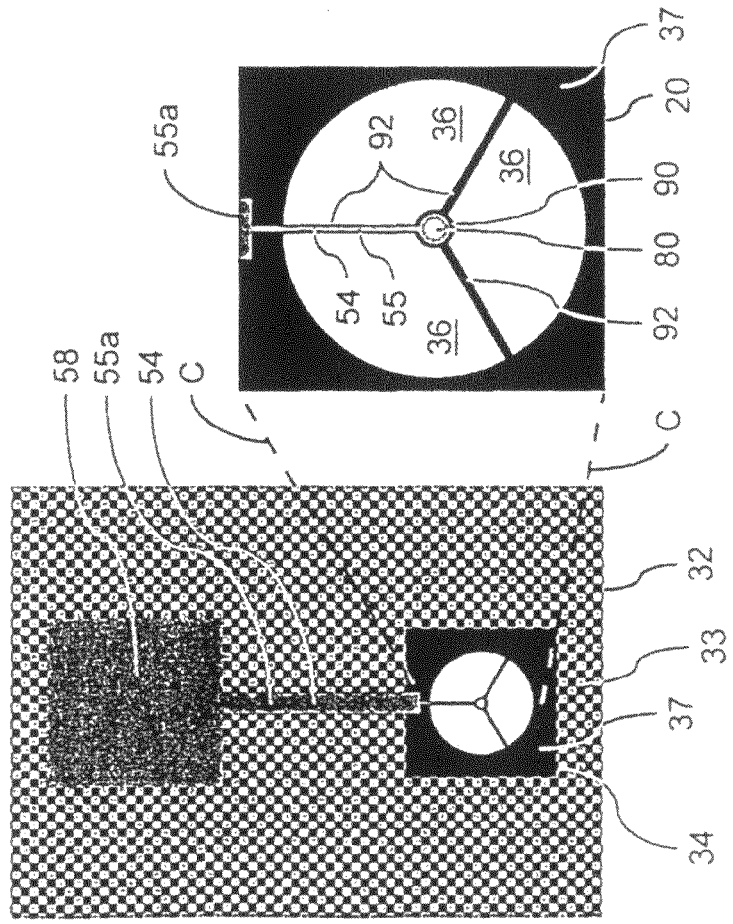
FIG. 13 shows a schematic top view of a chip with a membrane and Boersch phase plate with enlarged Section C, wherein layers 60 and 70 are made invisible.

FIG. 13 shows one possible design of the Boersch phase plate. In the representation the layers 60 and 70 of the finished phase plate have been made invisible in order to make the electrode visible. The phase plate, as shown in FIG. 13, comprises an annular lens 90 with embedded ring electrode 52. The central lens 90 possesses a bore 80 measuring about 1 m, through which the null beam 10 of the TEM 1 is guided. The central lens 90 is suspended via three suspension elements 92, whose component the connecting elements 38 are, in the aperture opening 36 in a self-supporting manner. In the operation of the lens 90 an electric field prevails essentially in the region of the bore 80, but not in the region of the aperture opening 36, through which the scattered electrons are guided.

The Boersch phase plate with its aperture opening 36 and frame-like aperture stop 37 is fixed in the frame-like mounting chip 32, which exhibits a considerably greater thickness D of in this example 200 μm, thus about 1000 times thicker than the membrane 30 and at least 100 times thicker than the total thickness of the phase plate 20. The lead comprises the connecting segment 55 and an externally wider lead segment 55a which extends from the window 34 depicted enlarged in Section C to the frame region of the chip 32, in order to run in the bonding field 58. Thus the layers 40, 50, 60, 70 are applied in Steps b) through e) onto the self-supporting membrane 30, which bridges the membrane window 34.

Figure 14:
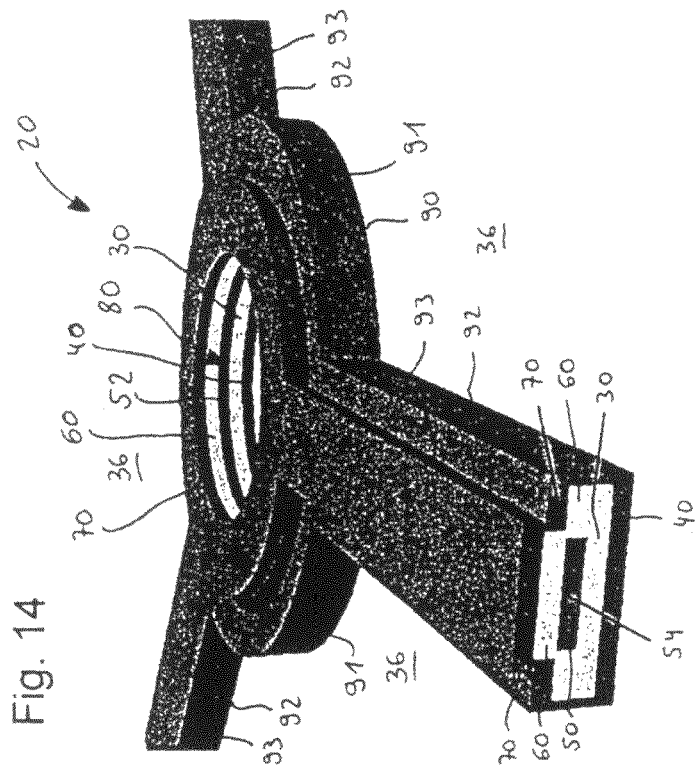
FIG. 14 shows a schematic cut perspective view of the lens of a Boersch phase plate produced in accordance with the invention with three suspension elements and FIG. 15 shows a schematic cross-sectional representation of a massive lens arrangement produced in accordance with the invention.

FIG. 14 shows the layer structure of the mounting elements 92 for insulating cladding and shielding as well as within the bore 80 of the central ring lens 90. Here is the best place to recognize that the lateral faces 91, 93 of the central ring lens 90 and of the suspension elements 92 are coated with the electric conductive material of the second shielding layer 70.

The advantages of a Boersch phase plate in comparison to a Zernicke phase plate in the case of use in a TEM are as follows:

As a result of the fact that the Boersch phase plate is enclosed by a metal layer, it withstands direct radiation through the electrons for a longer period of time.

By the application of various electric potentials to the ring electrode the strength of the electric field and with it the phase displacement of the null beam can be continuously set without removal of the phase plate.

The interaction between the image-generating electrons with the phase plate is, in contrast to the Zernicke phase plate, low, so that coherence and signal losses are significantly reduced.

In addition the phase displacement between non-scattered and scattered electrons is spatially constant, thus not subject to local fluctuations as in the case of the granular carbon layer in the case of the Zernicke phase plate.

Hereinbefore with the help of an exemplary embodiment the production of a Boersch phase plate 20 with a self-supporting lens 90 on suspension elements 92 was described. However, it is obvious to the person skilled in the art that the method in accordance with the invention can also be used for the production of electrodes with a closed surface or electrodes in manifold form. In this connection the step of the milling out of the aperture opening (step g)) is omitted and the arrangement does not need to be tilted in the case of the application of the second metallization layer 70.

Figure 15:
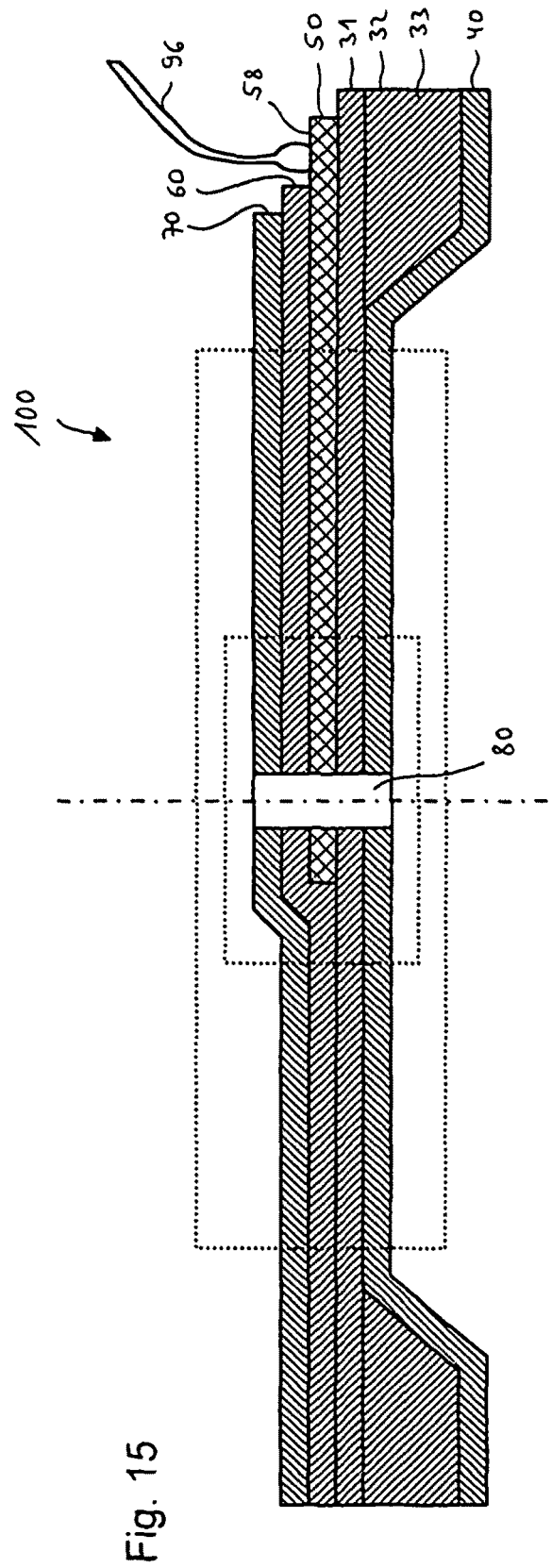

FIG. 15 shows one example for a cross-section through such a two dimensional massive lens arrangement 100 without an aperture opening.

In summary, a production method for electrostatic microlenses or nanolenses is proposed, by means of which a reduction of the lens size down to 1μ is possible. Through the selection of a suitable substrate and combination of lithography and nanostructuring techniques a great variability can be achieved with reference to the lens dimensions, field intensities and field distributions. With the method in accordance with the invention it is not only possible to realize massive multilayer microlenses or nanolenses, but rather, to the best of the inventors' knowledge for the first time a functioning Boersch phase plate, that is a self-supporting lens construction can actually be realized.

The invention claimed is:

1. A method for the production of a phase plate (20) for installation in an electron microscope (1), comprising the steps:

Providing of a manageable stable chip (32), wherein the chip (32) exhibits at least one thin self-supporting membrane (30) arranged in a membrane window (34) of the chip, said membrane defining a plane front (30a) of the chip, wherein the membrane remains in the form of a first insulating layer as part of the phase plate (20) to be generated, Application of an electric conductive first shielding layer (40) on a rear (30b) of the membrane opposite the front, Production of an electrode (52) and a lead (54) made of electric conductive material on the front of the membrane (30a), Milling out of an aperture opening (36) from the membrane (30) with recessing of an electrode carrier region (39) and at least one connecting element (38) as part of a suspension element (92) to be produced, wherein the electrode carrier region (39) is suspended on the connecting element (38), Application of an electric insulating second insulating layer (60) on the electrode carrier region (39) and the suspension element (92), so that the electrode (52) and at least partially the lead (54) are covered by the second insulating layer (60), wherein the electrode (52) and at least partially the lead (54) between the first and second insulating layer (30, 60) are enclosed, Application of an electrical conducting second shielding layer (70) on the side of the second insulating layer (60) opposite the electrode, wherein the phase plate (20) is tilted and/or rotated in order to coat the lateral faces (91, 93) of the electrode carrier region (39) and at least partially the suspension element (92) with the electric conductive material of the second shielding layer, wherein an electric contact between the first and second shielding layer (40, 70) is produced, as a result of which the first and second shielding layers form a closed electric shielding cage around the electrode (52) and at least partially the lead (54) and the shielding cage is electrically insulated from the electrode (52) by means of the first and second insulating layers (30, 60), Subsequent boring through of the phase plate (20) in the region of the electrode (52), wherein the inner opening (80) in the electrode is produced with a diameter between 1 nm and 100 μm, so that in the process the ring shape of the electrode (52) comes into being and the layers of the lens arrangement are exposed to the bore (80).

2. A phase plate (20) with frame-like manageable stable mounting chip (32), in particular for installation in a focal plane of an electron microscope lens (9), wherein the phase plate (20) has a frame-like aperture stop (37) which defines an aperture opening (36) for scattered electrons (16) in the electron microscope and wherein within the aperture opening (36) an electric lens (90) is provided for phase shift of the null beam (10) in the case of the passing through of the lens (90), wherein at least a first suspension element (92) bridges the aperture opening (36) and wherein the lens (90) is suspended at least the first suspension element (92) at the aperture stop (37), wherein the phase plate (20) has at least in the region of the lens (90) at least five layers a) through e) as follows:
a) a first electric conductive shielding layer (40),
b) a first insulating layer made of electric insulating material (30),
c) an electric conductive structured electrode layer (50) with an electrode (52) belonging to the lens and a lead (54),
d) a second insulating layer (60) made of electric insulating material,
e) a second electric conductive shielding layer (70), wherein the lens (90) exhibits a bore (80) which forms a continuous channel through the layers of the lens (90) so that the electrode (52) is shaped as a ring electrode around the bore (80) to generate the electric lens field (12) when applying an electric potential to the electrode (52) and wherein the manageable stable frame-like mounting chip (32) has a membrane window on (34) and the phase plate (20) is suspended with its aperture opening (36) and its frame-like aperture stop (37) in the membrane window (34) of the manageable stable mounting chip (32).

3. The phase plate (20) according to claim 2, wherein at least one of the layers a), b), d) or e) extend to the frame region (33) of the mounting chip (32).

4. The phase plate (20) according to claim 3, wherein the one layer comprises a self-supporting membrane (30) arranged in the membrane window (34) and a peripheral region (31a) constructed integrally with the membrane, said region extending in a planar manner on the frame region (33) of the mounting chip.

5. The phase plate (20) according to claim 3, wherein the thickness of the one layer in the region of the suspension element (92) alone is already dimensioned sufficiently in order to suspend the electrode (52) belonging to the central lens (90) in the aperture opening (36).

6. The phase plate (20) according to claim 3, wherein the one layer is the first insulating layer.

7. The phase plate (20) claim 2, wherein the first insulating layer is a silicon nitride layer.

8. The phase plate (20) according to claim 2, wherein the first insulating layer exhibits a thickness between 1 nm and 5 μm.

9. The phase plate (20) according to claim 2, wherein the lead (54) is constructed integral with the ring electrode (52) and extends along the suspension element (92) from the ring electrode (52) to the mounting chip (32) in order to be able to apply an electric potential to the electrode (52) from the outside.

10. The phase plate (20) according to claim 2, wherein the lead (54) comprises an oblong connecting segment (55) which extends radially on the first connecting element (38) from the ring electrode (52) to the mounting chip (32) and which comprises a bonding field (58) on the mounting chip (32) next to the connecting segment (55) to be able to supply a voltage to the ring electrode by means of a power supply connected to the bonding field (58) and wherein the ring electrode (52), the connecting segment (55) and the bonding field (58) are integrally constructed.

11. The phase plate (20) according to claim 2, wherein the phase plate (20) comprises several suspension elements (92) arranged in starlike manner around the lens radially spanning the aperture opening (36), by means of which the lens in the aperture opening (36) is suspended at the aperture stop (37).

12. The phase plate (20) according to claim 11, wherein the further suspension elements (92) are built in sandwich-like manner and comprise at least the four layers a), b), d) and e).

13. The phase plate (20) according to claim 11, wherein the layers of the further suspension elements (92) are each constructed integrally with the corresponding layers of the central lens and of the first suspension element (92).

14. The phase plate (20) according to claim 11, wherein the thicknesses of the layers a) through c) in the region of the suspension elements alone are dimensioned sufficiently large in order to suspend the electrode (52) belonging to the lens in the aperture opening (36).

15. The phase plate (20) according to claim 2, wherein the first and second insulating layers (30, 60) jointly form an electric insulating cladding around the ring electrode (52) and the lead (54) that is closed to the outside, wherein the cladding runs in annular manner around the ring electrode (52) and extends at least to the outer edge of the aperture opening (36).

16. The phase plate (20) according to claim 15, wherein the first and second shielding layers (40, 70) jointly form an electric conductive cage around the electric insulating cladding that is closed to the outside, wherein the conductive cage runs in annular manner around the cladding and extends at least to the outer edge of the aperture opening (36).

17. The phase plate (20) according to claim 2, wherein the first suspension element (92) is built in sandwich-like manner of the five layers a) through e) over its entire length from the lens (90) to the outer edge of the aperture opening (36).

18. The phase plate (20) according to claim 2, wherein the five layers a) through e) of the lens (90) and the five layers a) through e) of the first suspension element (92) at least to the outer edge of the aperture opening (36) are constructed integrally in pairs.

19. Phase contrast transmission electron microscope (1), comprising:
an electron source (2) for radiation of a sample (8) with an electron beam (4) in the light transmission method,
an image forming lens system,
a phase plate (20) in accordance with claim 2, arranged in the back focal plane of an electron microscope lens (9) and an image recording device (24) for the photographing of an enlarged image of the sample behind the phase plate (20).

20. A method for the production of a multilayer electrostatic lens arrangement (20, 100) with at least one lens electrode (52) which is electrically shielded on both sides by means of shielding layers (30, 60) in order to produce an electric field in an inner opening (80) of the lens electrode, comprising the steps:
a) Providing of a chip (32) which exhibits at least one membrane window (34) with a membrane (30) made of a first membrane material, wherein the membrane (300 represents a first layer (31) of the lens arrangement (20, 100) to be produced,
b) Applying of a second layer (40) made of
a coating material on a first side (30b) of the membrane (30), wherein either the membrane material is an electric insulating material and the coating material is an electric conductive material or the membrane material is an electric conductive material and the coating material is an electric insulating material, so that an at least two-layer membrane (30, 40) comes into being from an electric insulating first insulating layer and an electric conductive first shielding layer (40),
c) Production of an electrode (52) and a lead (54) from electric conductive material on the electric insulating layer of the membrane (30),
d) Applying of an electric insulating second insulating layer (60) at least on the electrode (52) and the lead (54),
e) Applying of an electric conductive second shielding layer (70) on the second insulating layer (60), so that in the membrane window (34) a sandwich-like layer arrangement comes into being which comprises in the region of the electrode at least the five following layers: the first shielding layer, the first insulating layer, the electrode, the second insulating layer and the second shielding layer,
f) Boring through of the layer arrangement in the region of the electrode (52), wherein the inner opening (80) is produced in the electrode (52).

21. The method according to claim 20, wherein as the membrane (30) of the chip (32) in Step a) a silicon nitride membrane is used.

22. The method according to claim 20, wherein the membrane (30) exhibits a thickness between 1 nm and 5 µm.

23. The method according to claim 20 wherein the boring through of the layer arrangement is carried out by means of micromilling or nanomilling.

24. The method according to claim 20, wherein the boring through of the layer arrangement is carried out by means of a focused ion beam.

25. The method according to claim 20, wherein Step c) comprises:
Structuring of an electric conductive electrode layer (50) applied to the electric insulating layer of the membrane by means of photolithography or electron beam lithography with spin-coating and lift off technique, wherein the form of the electrode (52) and an essentially oblong form of the lead (54) are produced.

26. The method according to claim 20, wherein the lens arrangement is produced in the form of a phase plate (20) for an electron microscope (1), wherein the phase plate (20) exhibits a frame-like aperture stop (37) which defines an inner aperture opening (36) for scattered electrons (16) in the electron microscope, wherein within the aperture opening a lens electrode (52) is suspended by means of at least one suspension element (92) on the aperture stop (37),
wherein
the membrane (30) exhibits at least the size of the aperture stop (37) and
in a Step g) following at least Step a) the aperture opening (36) is produced, wherein an electrode carrier region around the electrode (52) and at least a first connecting element (38) of the membrane (30) remain in existence, such that the electrode carrier region (39) is suspended in the interior of the aperture opening (36) by means of the first connecting element (38) on the aperture stop (37).

27. The method according to claim 26, wherein in Step g) the aperture opening (36) is milled out of the membrane (30) with recessing of the electrode carrier region (39) and of at least one connecting element (38).

28. The method according to claim 27, wherein the milling out is carried out by means of a focused ion beam.

29. The method according to claim 26, wherein prior to the production of the aperture opening (36) a plurality of position markings (56) for positioning of the arrangement for Step g) is produced.

30. The method according to claim 26, wherein in step g) several connecting elements (38) arranged in starlike manner around the electrode carrier region remain in existence, by means of which the electrode carrier region (39) is suspended on the aperture stop (37).

31. The method according to claim 26, wherein in Step b) the second layer is applied at least on the entire area of the aperture stop (37).

32. The method according to claim 26, wherein in Step c) the lead (54) is produced as extending from the electrode (52) to at least one frame region (33) of the chip (32) framing the membrane window (34).

33. The method according to claim 26, wherein the lead (54) runs on the first connecting element (38), the connecting element exhibits a greater width than the lead (54) and the electrode carrier region (39) exhibits a greater diameter than the electrode (52) and the lead (54) and the electrode (52) are framed in a top view by the substrate material.

34. The method according to claim 26, wherein the application of the second insulating layer (60) is carried out in accordance with Step d) after the production of the aperture opening (36) in accordance with Step g).

35. The method according to claim 26, wherein Steps d) through g) are carried out in the following sequence:
   Production of the aperture opening in accordance with Step g),
   subsequent application of the second
   insulating layer (60) in accordance with Step d),
   subsequent application of the second shielding layer (70) on the second insulating layer (60) in accordance with Step e),
   subsequent boring through of the phase plate (20) to be produced in accordance with Step f).

36. The method according to claim 26, wherein the phase plate (20) is tilted and/or rotated in the case of the application of the second shielding layer (70) in order to coat the lateral faces (91) of at least the electrode carrier region (39) with the electric conductive material of the second shielding layer (70), wherein an electric contact between the first and the second shielding layers (40, 70) is produced, as a result of which the first and second shielding layers form a closed electric shielding cage around the electrode (52) and the shielding cage is electrically insulated from the electrode (52) by means of the first and second insulating layers (30, 60).

37. A multilayer lens arrangement (20, 100), producible with the method in accordance with any claim 20.

* * * * *

UNITED STATES PATENT AND TRADEMARK OFFICE
CERTIFICATE OF CORRECTION

PATENT NO. : 8,487,268 B2  
APPLICATION NO. : 11/990907  
DATED : July 16, 2013  
INVENTOR(S) : Dagmaar Gerthsen, Fabian Perez-Willard and Katrin Schultheiss It is certified that error appears in the above-identified patent and that said Letters Patent is hereby corrected as shown below:

Title page after (54) and in the Specification, column 1, Title, insert --Method for the Production of a Multilayer Electrostatic Lens Array--

Signed and Sealed this  
Twenty-fourth Day of September, 2013

Teresa Stanek Rea  
*Deputy Director of the United States Patent and Trademark Office*